(12) United States Patent
Chen et al.

(10) Patent No.: US 7,613,485 B2
(45) Date of Patent: Nov. 3, 2009

(54) SLIDING MODULE AND ITS AXLE STRUCTURE

(75) Inventors: Chia-Cheng Chen, Sinjhuang (TW); Chung Wei Chen, Sinjhuang (TW); Hua Feng Hsu, Sinjhuang (TW)

(73) Assignee: Jarllytec Co., Ltd., Taipei County (TW)

( * ) Notice: Subject to any disclaimer, the term of this patent is extended or adjusted under 35 U.S.C. 154(b) by 485 days.

(21) Appl. No.: 11/500,102

(22) Filed: Aug. 7, 2006

(65) Prior Publication Data

US 2007/0030590 A1    Feb. 8, 2007

(30) Foreign Application Priority Data

Aug. 8, 2005    (TW) ............................... 94213456 U

(51) Int. Cl.
*H04M 1/00*    (2006.01)
(52) U.S. Cl. .............. 455/575.4; 455/575.1; 455/575.3; 455/575.8; 379/433.11; 379/433.12; 379/433.13
(58) Field of Classification Search ......... 455/571–574; 379/433.11–13; 345/160–161
See application file for complete search history.

(56) References Cited

U.S. PATENT DOCUMENTS

| 7,158,816 B1 * | 1/2007 | Mizuta et al. ............. 455/575.3 |
| 2004/0121826 A1 * | 6/2004 | Ma et al. .................. 455/575.4 |
| 2005/0113154 A1 * | 5/2005 | Park et al. ................ 455/575.4 |
| 2007/0091555 A1 * | 4/2007 | Lee ............................. 361/683 |

* cited by examiner

*Primary Examiner*—Ajit Patel
*Assistant Examiner*—Michael Irace
(74) *Attorney, Agent, or Firm*—Guice Patents PLLC

(57) ABSTRACT

A sliding module comprises a sliding member having a transversal plate disposed transversally and coupled vertically at a substantially middle position of two sliding plates, and the transversal plate includes a rectangular transversal groove, and the transversal groove includes a through hole disposed at an external side of the transversal groove; a spindle member being a rectangular spindle plate and includes a spindle hole disposed separately on both sides of the spindle member, and a spindle bolt passes through one of said spindle holes and is coupled to the transversal groove; a tension spring with both ends separately including a spring hook and one of the spring hooks is latched into the through hole, and another spring hook is latched into a bolt aperture of a spindle bolt above the transversal groove; and a slid member being a driven plate with both lateral sides bent into a sliding groove for embedding an external side of the sliding plate, and the driven plate includes a plate aperture for passing a spindle bolt through another spindle hole and coupling the spindle bolt; thereby, the tension spring stores energy if pushed, and the slid member continues sliding all the way to a position of releasing energy after the slid member is pushed more than half of the traveling path. The sliding module further connects an axle structure, and the axle structure comprises a vertical first pivotal axle and a horizontal second pivotal axle, and by means of the installation of the two pivotal axles, the sliding module provides the multi-directional pivotal rotating, idling and positioning functions.

10 Claims, 5 Drawing Sheets

SLIDING MODULE AND ITS AXLE STRUCTURE

BACKGROUND OF THE INVENTION

1. Field of the Invention

The present invention relates to a sliding module, and more particularly to a sliding module that connects a tension spring and a spindle plate to two modules respectively, so that the two modules can slide with respect to each other. If the sliding modules are coupled to the upper and lower modules respectively, the two modules can be stacked with each other or pulled from each other. Further, the sliding module is connected to an axle structure, such that the upper module has the multi-directional pivotal rotating, idling and positioning functions.

2. Description of the Related Art

Sliding modules are used extensively in our life, and a drawer is one of the common examples, and sliding modules substitute a lift-and-close mode. Two modules are shifted, so that the two modules are stacked with each other or pulled away from each other. For example, a clamshell mobile phone adopts a cover that can be lifted open or closed with respect to its lower base by a spindle mode or a hinge mode.

With the unceasing developments made by manufacturers, sliding modules have been applied to various different objects having a cover, such as a slider set mobile phone having an upper cover stacked onto a base at an operating mode or the upper cover covering an operating panel at a closing mode, but if the upper cover is slid and pulled, then the operating panel is exposed at an operating mode. Of course, the upper cover can be pulled to selectively cover the operating panel at the closing mode and stacking the upper cover onto the operating panel at the operating mode.

Besides the basic pulling and stacking functions of the aforementioned sliding module, the sliding module can be slid automatically. In other words, when the upper cover is slid to a specific position, the upper cover will keep on sliding automatically without requiring users to manually pull the cover all the way to the end of the traveling path, and thus making the application more convenient.

Further, digital capturing devices such as digital cameras and digital camcorders have changed our way of taking pictures or recording video films. Basically, the digital capturing devices of this sort usually come with a small display screen on the casing of the devices for facilitating viewing and browsing the pictures or films. Preferably, the casing and the display screen include a spindle such that the display screen can be opened or shut or even can be revolved in a larger angle. At present, mobile phones tend to integrate with a digital capturing device, and these spindle structures are used extensively for the folding mobile phones such as the NOKIA 6260 smart phones, but such sliding structures have never been used in the slider set mobile phones yet, and thus the application of the sliding modules has been restricted significantly, and further improvements are needed.

SUMMARY OF THE INVENTION

In view of the foregoing shortcomings of the prior art, the inventor of the present invention based on years of experience in the related industry to conduct extensive researches and experiments, and finally invented a sliding module and its axle structure in accordance with the present invention.

The primary objective of the present invention is to provide a sliding module that comprises: a sliding member having a transversal plate disposed transversally and coupled vertically at a substantially middle position of two sliding plates, and the transversal plate includes a rectangular transversal groove, and the transversal groove includes a through hole disposed at an external side of the transversal groove; a spindle member being a rectangular spindle plate and the spindle member includes a spindle hole disposed separately on both sides of the spindle member, and a spindle bolt passes through one of the spindle holes and is coupled to the transversal groove; a tension spring with both ends separately including a spring hook, and one of the spring hooks is latched into the through hole, and another spring hook is latched into a bolt aperture of a spindle bolt above the transversal groove; and a slid member being a driven plate with both lateral sides bent into a sliding groove for embedding an external side of the sliding plate, and the driven plate includes a plate aperture for passing a spindle bolt through another spindle hole and coupling the spindle bolt; such that the tension spring stores energy if pushed, and the slid member continues sliding all the way to a position of releasing energy after the slid member is pushed more than half of the traveling path.

Another objective of the present invention is to provide a sliding module, wherein the external sides of the sliding module are bent, and the sliding plate includes a positioning hole for connecting an object, and each corner of the driven plate has a fixing hole for connecting the object.

A further objective of the present invention is to provide a sliding module having a structure that comprises: a sliding member having a transversal plate disposed transversally and coupled vertically at a substantially middle position of two sliding plates, and the transversal plate includes a rectangular transversal groove, and the transversal groove includes a through hole disposed at an external side of the transversal groove; a spindle member being a rectangular spindle plate and the spindle member includes a spindle hole disposed separately on both sides of the spindle member, and a spindle bolt passes through one of the spindle holes and is coupled to the transversal groove; a tension spring with both ends separately including a spring hook and one of the spring hooks is latched into the through hole, and another spring hook is latched into a bolt aperture of a spindle bolt above the transversal groove; and a slid member being a driven plate with both lateral sides bent into a sliding groove for embedding an external side of the sliding plate, and the driven plate includes a plate aperture for passing a spindle bolt through another spindle hole and coupling the spindle bolt; and an axle structure installed above the slid member and further comprising: a first pivotal axle coupled at the top of the slid member by a stand board, and having an axle pillar passing through at least one resilient member, a spindle hole of the stand board, and a stand hole of a support stand to connect the foregoing components as a whole; a second pivotal axle with an end coupled to a vertical wall of the support stand through a pillar and another end passing through a plate aperture of a connecting board and at least one resilient member to connect the foregoing components as a whole; such that the tension spring stores energy if pushed, and the slid member continues sliding all the way to a position of releasing the energy after the slid member is pushed more than half of the traveling path, and the support stand of the first pivotal axle can be turned to the front or the back with respect to the slid member, and the connecting board of the second pivotal axle can be rotated on the support stand, so that the axle structure has the multi-directional pivotal rotating, idling and positioning functions.

Another further objective of the present invention is to provide a sliding module having an axle structure, wherein the spindle hole of the stand board and the stand hole of the support stand include a stop latch and a pushing latch protruded coaxially and alternatively in opposite directions at the periphery, and a limit plate is installed between the stand board and the support stand, and a pushing flange and a stop flange are protruded according to a desired rotary angle, such that when the support stand rotates, the pushing latch pushes the pushing flange until the stop flange presses the stop latch to restrict the angle of turning the support stand.

A further objective of the present invention is to provide a sliding module having an axle structure, wherein a fixing plate is installed between the pillar and the connecting board, and the fixing plate having two connecting plates is protruded from the fixing plate and fixed to the pillar, and at least one stop flange is protruded from the periphery of the fixing plate and coupled to a stop tenon protruded from the periphery of the plate aperture at the bottom surface of the connecting plate, such that when the connecting plate is rotated, the stop tenon is in contact with the stop flange for stopping the rotation of the connecting plate.

A further objective of the present invention is to provide a sliding module of a sliding module, wherein at least one plate protrusion is protruded from the periphery of the plate aperture of the connecting board and at least one groove is disposed on a corresponding surface of the fixing plate, such that if the connecting plate is rotated, the plate protrusion is rotated synchronously and thus giving a significant touch of a height difference when the plate protrusion falls into the groove.

Refer to the figures for the further disclosure of the technical contents of the present invention, wherein FIG. 1 is an exploded view of a sliding module and an axle structure of the present invention; FIG. 2 is an exploded view of a sliding module viewing from an opposite direction as depicted in FIG. 1; FIG. 3 is a perspective view of a sliding module of the present invention; FIG. 4 is a cross-sectional view of Section A-A of FIG. 3; and FIG. 5 is a cross-section view of a sliding module of the present invention.

To make it easier for our examiner to understand the objective of the invention, its structure, innovative features, and performance, we use a preferred embodiment together with the attached drawings for the detailed description of the invention.

DETAILED DESCRIPTION OF THE PREFERRED EMBODIMENTS

The structure, technical measures and effects of the present invention will now be described in more detail hereinafter with reference to the accompanying drawings that show various embodiments of the invention.

Figure 1:
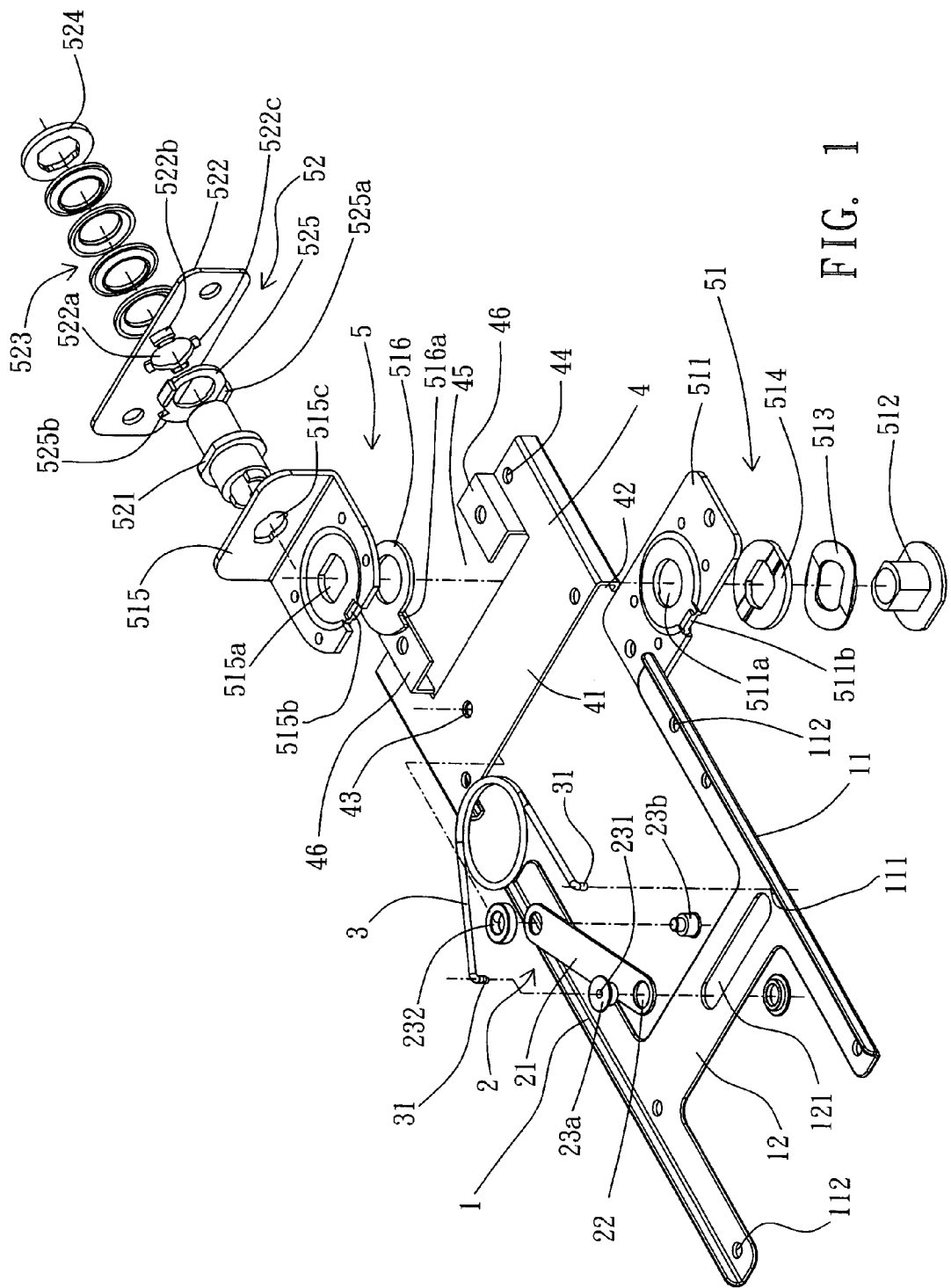
FIG. 1 is an exploded view of a sliding module and an axle structure of the present invention.
Figure 2:
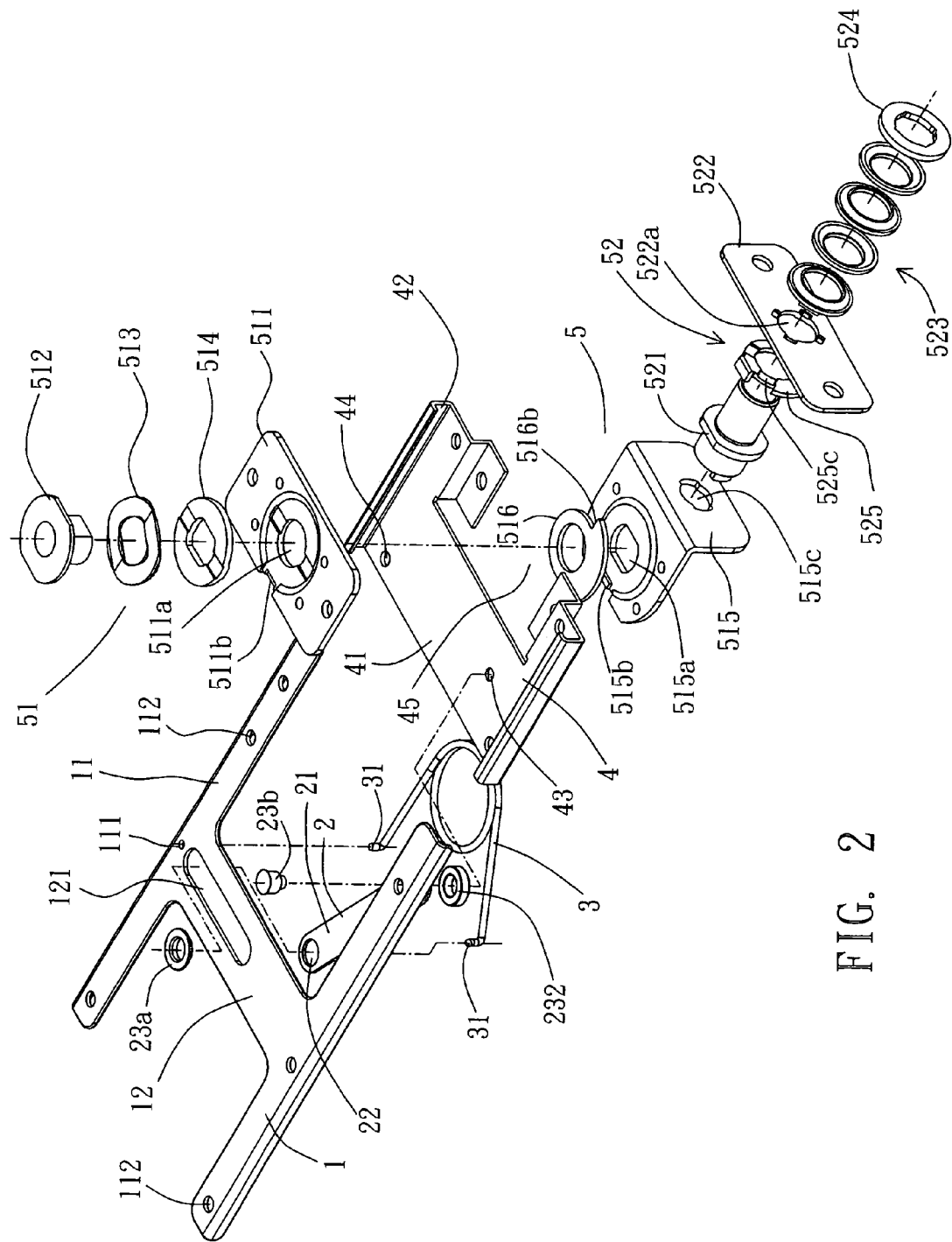
FIG. 2 is an exploded view of a sliding module and an axle structure viewing from an opposite direction as depicted in FIG. 1.
Figure 3:
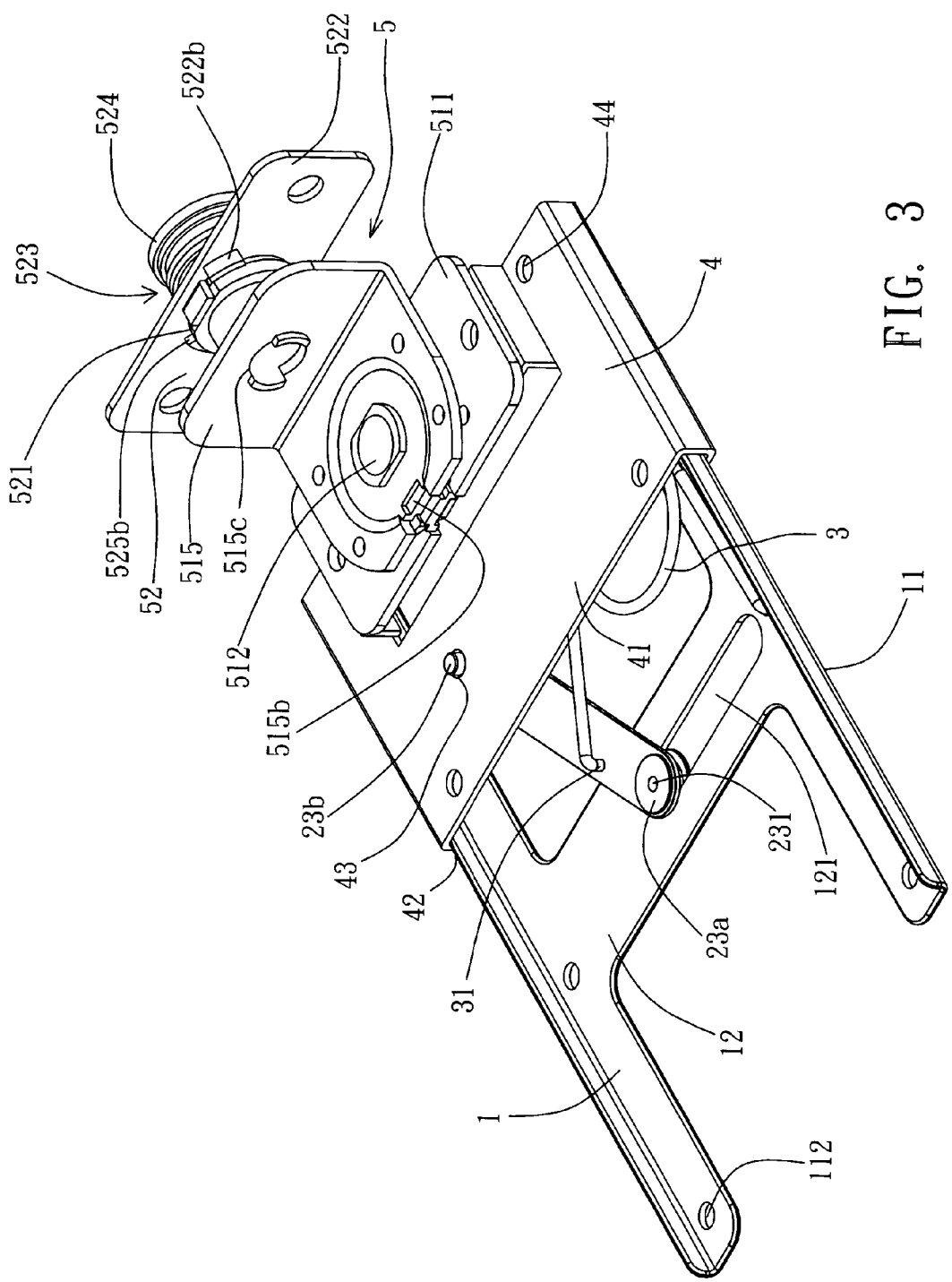
FIG. 3 is a perspective view of a sliding module of the present invention.
Figure 4:
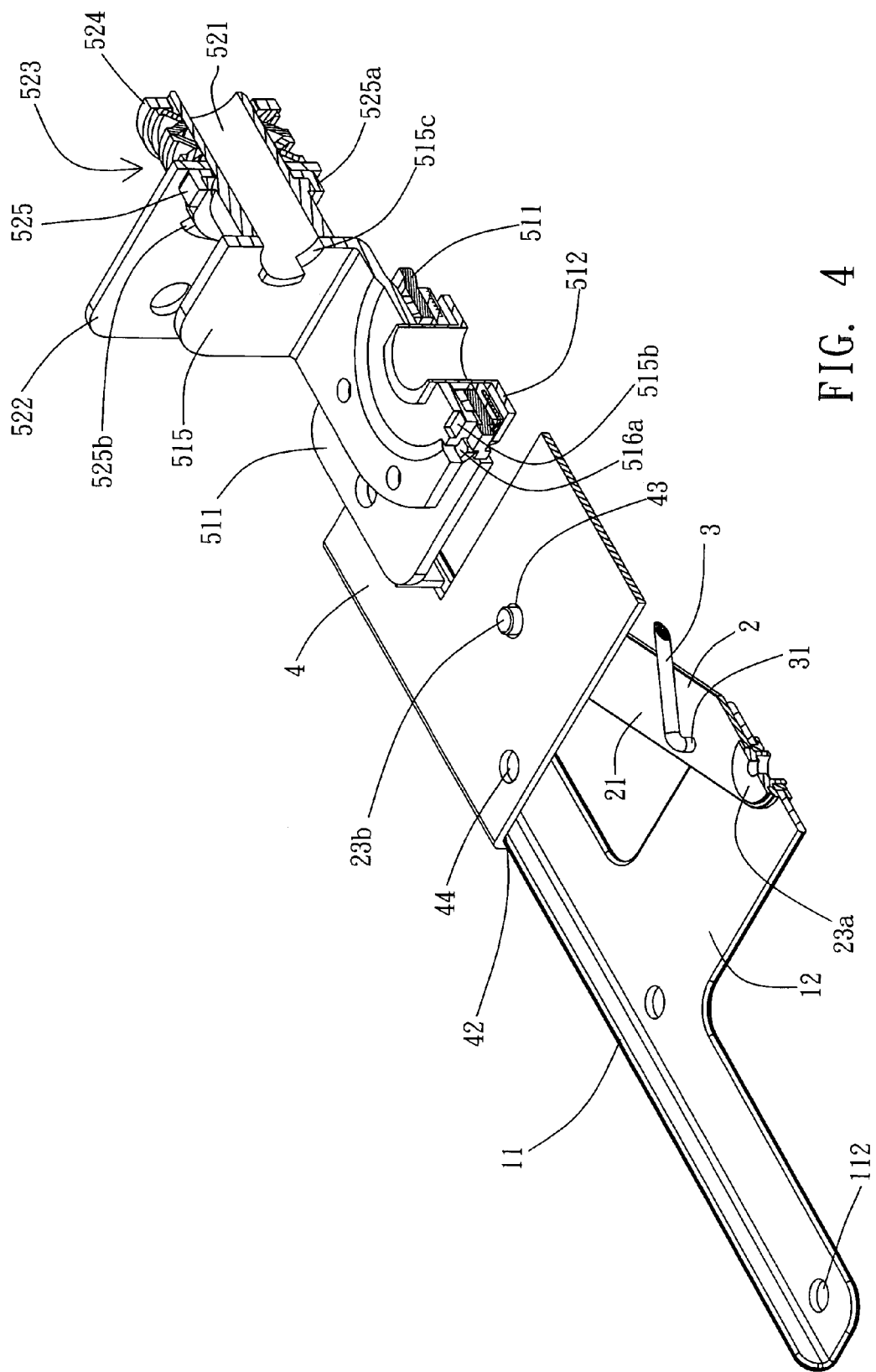
FIG. 4 is a cross-sectional view of Section A-A as depicted in FIG. 3.
Figure 5:
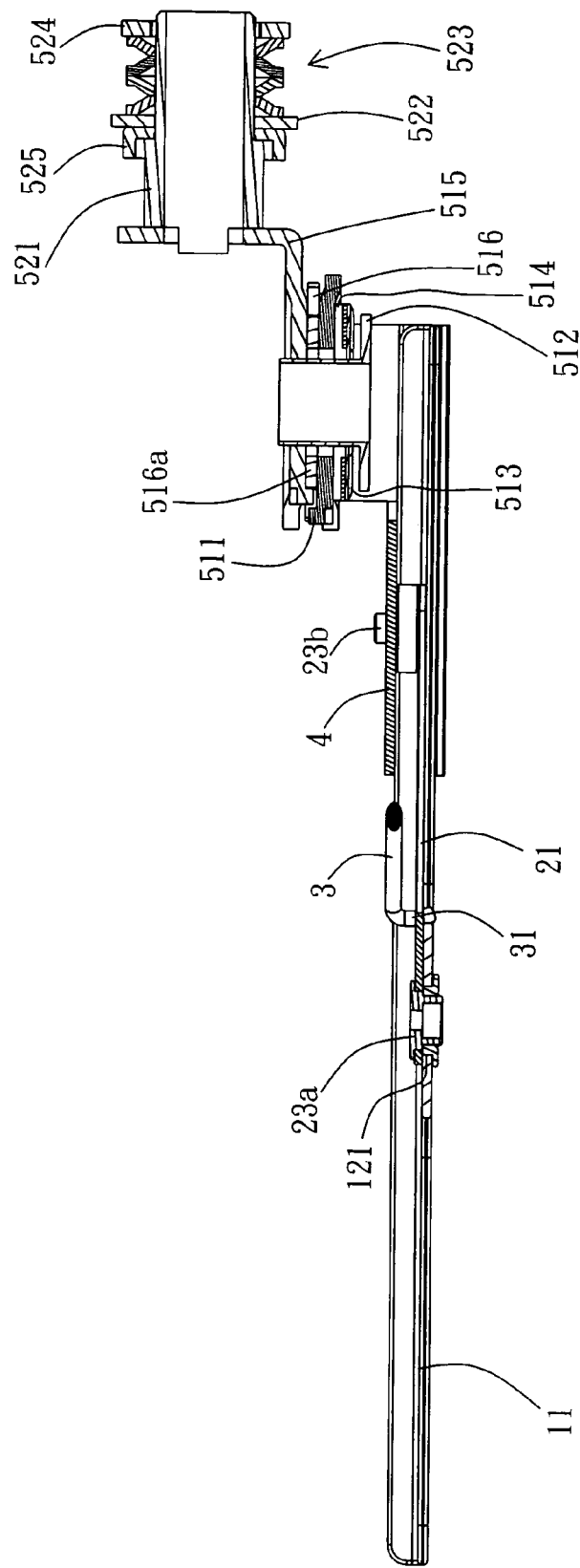
FIG. 5 is a cross-section view of a sliding module of the present invention.

Referring to FIGS. 1 to 3, the sliding module of the present invention is an improvement over R.O.C. Pat. Application No. 094206238 (which is a counterpart of P.R.C. Pat. Application No. 200520011854.6), the aforementioned methods are merged into the present invention, and the present invention comprises a sliding member 1, a spindle member 2, a tension spring 3 and a slid member 4. Further the top of the slid member 4 is coupled to an axle structure 5.

The sliding member 1 is a substantially a H-shape plate body having a rectangular sliding plate 11 disposed on both sides of the sliding member 1, and the external side of the sliding plate 11 is bent internally into a curved shape, but it is a prior art and thus will not be described here. A transversal plate 12 is fixed transversally and substantially in the middle of the two sliding plates 11, and a lateral side of the transversal plate 12 includes a rectangular penetrating transversal groove 121. Further, the sliding plate 11 at an external side of the transversal groove 121 includes a through hole 111, such that the sliding member 1 can be connected to an object such as a lower module. The sliding plate 11 includes a plurality of positioning holes 112, but it is a prior art and thus will not be described here.

The spindle member 2 is a rectangular spindle plate 21 and includes a spindle hole 2 disposed separately on both sides of the spindle member 2, and a spindle bolt 23a, 23b passes through one of the spindle holes 22 of the spindle plate 21 and is coupled to the transversal groove 121 by the spindle bolt 23a or could be in a sliding state, and another end of the spindle hole 22 could be another spindle bolt 23b passing through the slid member 4 and being connected to the slid member 4. In practice applications, the top of the spindle bolt 23a includes a bolt aperture 231, and another spindle bolt 23b can install a washer 232.

The tension spring 3 is a resilient member. Unlike the aforementioned patented inventions, both ends of the tension spring 3 are bent into a spring hook 31. Two spring hooks 32 are latched respectively into the through hole 111 and the bolt aperture 231 for defining a positioning relation.

The slid member 4 is a driven plate 41 having a bent sliding groove 42 disposed on both lateral sides of the slid member 4 and having a size large enough to accommodate the external end of the sliding plate 11 for providing an embedment with a sliding state. The spindle bolt 23b is used for coupling the slid member 4 with the spindle member 2, and the driven plate 41 includes a plate aperture 43. In the meanwhile, each corner of the driver plate 41 has a plurality of fixing holes 44 for connecting an object such as an upper module.

Referring to FIG. 3, two spring hooks 31 of the invention are latched into the bolt aperture 231 and the through hole 111 respectively, and the spindle bolt 23a passes through the spindle hole 22 of the spindle plate 21 and the transversal groove 121 for a connection, and the slid member 4 is embedded into the external position of the two sliding plates 11 by its sliding groove 42. In the meantime, the spindle bolt 23b passes through another spindle hole 22 of the spindle plate 21, the washer 232 and the plate aperture 43 for its positioning, so that the sliding member 1 is connected to a lower module such as a base, and the slid member 4 is connected to an upper module such as a cover, or vice versa. Therefore, the cover can be slid with respect to the base. For example, the slid member 4 is at an operating state when the slid member 4 is extended outward from the sliding member 1. If a force is applied to the slid member 4 in an opposite direction, the slid member 4 will be set to a closing state.

The principle of operation of the present invention resides on that when the slid member 4 is pushed outward, the tension spring 3 is compressed by the rotation of the spindle member 2 to store energy, and the slid member 4 is stacked on the sliding member 1, and thus an end of the spindle member 2 situated at the transversal groove 121 together with a lateral side of the spindle bolt 23a move outward along the transversal groove 121. When the spindle member 2 is moved to the utmost external side, an equilibrium state is accomplished, and then the tension spring 3 stores its maximum energy. If a force is applied, the tension spring 3 will release energy to extend and drive the spindle bolt 23a of the spindle member 2 to move along the internal side of the transversal groove 121, and thus will drive the slid member 4 to extend out from the sliding member 1, and if such arrangement is applied to an object, then an operating state can be achieved.

On the other hand, if it is necessary to cover the sliding member 1 and the slid member 4 is pushed inward to half of the traveling path, the slid member 4 will be extended outward by the released energy of the tension spring 3. If such arrangement is applied to an object, then a closing state can be achieved.

Referring to FIGS. 1 to 5, the slid member 4 of the sliding module further comprises an axle structure 5 for achieving the sliding function as well as the multi-directional pivotal rotating, idling and positioning functions, wherein the external edge of the slid member 4 includes a rectangular board indent 45 and a connecting portion 46 disposed separately on both sides of the board indent 45 as shown in the figure, and the connecting portions 46 are substantially an L-shape frame.

The axle structure 5 is disposed at the top of the slid member 4 and comprises a first pivotal axle 51 and a second pivotal axle 52 disposed vertically and parallelly with said slid member 4.

The first pivotal axle 51 is a stand board 511 coupled to a connecting frame 46 disposed on both sides of the board indent 45, and an axle pillar 512 passes through at least a resilient member 513, a spacer 514, a spindle hole 511a of the stand board 511 and a stand hole 515a of a support stand 515, and an end of the axle pillar 512 is pivotally coupled to connect the foregoing elements as a whole and provide the function of a pivotal axle. The support stand 515 can be rotated by external forces and having a limited angle of rotation, and a stop latch 511b and a pushing latch 515b are installed coaxially and alternately at the periphery of the spindle hole 511a and the stand hole 515a, and a limit plate 516 is installed between the stand board 511 and the support stand 515, of which an axle pillar 512 is passed and a pushing flange 516a and a stop flange 516b are protruded according to a rotary angle. If the support stand 515 is rotated, the pushing latch 515b will push the pushing flange 516a, until the stop flange 516b presses on the stop latch 511b as shown in the figure, and the pushing flange 516a and the stop flange 516b are installed at 180 degree with respect to each other.

The second pivotal axle 52 has an end of a pillar 521 connected to a vertical branch hole 515c of the support stand 515 and another end of the pillar 521 passing through a plate aperture 522a of a connecting board 522, at least one resilient member 523 and a spacer 524, and then an end of the pillar 521 is riveted, so that the foregoing components are connected as a whole to provide the function of a pivotal axle, wherein the resilient member 513, 523 could be a spring, a wavy bracket or a disc bracket. To provide a limited angle of rotation for the connecting board 522, a fixing plate 525 is installed between the pillar 521 and the connecting board 522 for passing the pillar 521 and fixing the pillar 521 thereon as shown in the figure. Two connecting plates 525a are protruded from the fixing plate 525 and connected to the pillar 521 with a fixed state. Further, at least one stop flange 525b is protruded from the periphery of the fixing plate 525, and a stop tenon 522b is protruded from the periphery of the plate aperture 522a at the bottom surface of the connecting plate 522. If the connecting plate 522 is rotated, the stop tenon 522b is in contact with the stop flange 525b for stopping the rotation. Further, the invention comes with a significant touch of a height difference during its operation. At least one plate protrusion 522c is protruded from the periphery of the plate aperture 522a, and at least one groove 525c is disposed at the corresponding surface of the fixing plate 525, such that if the connecting plate 522 is rotated, the plate protrusion 522c is rotated synchronously, and thus producing a significant touch of height difference when the plate protrusion 522c falls into the groove 525c.

With the implementation of the present invention, the sliding module can be operated more conveniently by the energy storage and release of the tension spring. In other words, a user needs not to push the sliding member all the way but just to a half way of the traveling path for an automatic extension or closing. Further, the top of the slid member of the sliding module includes an axle structure having a first pivotal axle disposed vertically with the axle structure and a second pivotal axle disposed horizontally with the axle structure. When the sliding module is coupled separately to an upper module and a lower module, the upper and lower modules will be stacked with each other or pulled away from each other. Further, the upper module is divided into a left module and a right module. If the base has an operating portion of the lower module coupled with the sliding member and the left module of the upper module installs a slid member, and the right module is coupled to the second pivotal axle, and the left module has a menu portion and the right module has a display portion, the right module can be turned forward or backward to an angle of 180 degrees and rotated freely thereon during the operation, such that the right module of the upper module provides the multi-directional pivotal rotating, idling and positioning functions. The present invention is definitely a novel breakthrough of the sliding module.

The present invention provides a feasible solution, and a patent application is duly filed accordingly. However, it is to be noted that the preferred embodiments disclosed in the specification and the accompanying drawings are not intended to limit the invention. To the contrary, it is intended to cover various modifications and similar arrangements and procedures, and thus the scope of the appended claims should be accorded the broadest interpretation so as to encompass all such modifications and similar arrangements and procedures.

What is claimed is:

1. A sliding module, comprising:
    a sliding member having a transversal plate disposed transversally and coupled vertically at a substantially middle position of two sliding plates, said transversal plate including a rectangular transversal groove extending through top and bottom surfaces thereof, one of said two sliding pates including a through hole, and said transversal groove being spaced apart from said through hole;
    a spindle member, being a rectangular spindle plate and including a spindle hole disposed separately on both sides of the spindle member, and a spindle bolt passing through one of said spindle holes and being coupled to said transversal groove;
    a tension having a first spring hook located on a first end thereof and a second spring hook located on a second end thereof, the first spring hook being latched into said through hole, and said second spring hook being latched into a bolt aperture of a spindle bolt above said transversal groove, the second spring hook being selectively movable along a length of said transversal groove; and
    a slid member, being a driven plate with both lateral sides bent into a sliding groove for embedding an external side of said sliding plate, and said driven plate including a plate aperture for passing a spindle bolt through another spindle hole and coupling said spindle bolt;

thereby, said tension spring stores energy if pushed, and said slid member continues sliding all the way to a position of releasing said energy after said slid member is pushed more than half of the traveling path.

2. The sliding module of claim 1, wherein said sliding plate is bent at an external side of said sliding plate.

3. The sliding module of claim 1, wherein said sliding plate comprises a positioning hole for coupling an object, and said driven plate comprises a fixing hole disposed separately at each corner for coupling said object.

4. The sliding module of claim 1, wherein said spindle bolt further installs a washer.

5. A sliding module with an axle structure, comprising:

a sliding member having a transversal plate disposed transversally and coupled vertically at a substantially middle position of two sliding plates, said transversal plate including a rectangular transversal groove extending through top and bottom surfaces thereof, one of said two sliding pates including a through hole, and said transversal groove being spaced apart from said through hole;

a spindle member, being a rectangular spindle plate and including a spindle hole disposed separately on both sides of the spindle member, and a spindle bolt passing through one of said spindle holes and coupled to said transversal groove;

a tension having a first spring hook located on a first end thereof and a second spring hook located on a second end thereof, the first spring hook being latched into said through hole, and said second spring hook being latched into a bolt aperture of a spindle bolt above said transversal groove, the second spring hook being selectively movable along a length of said transversal groove;

a slid member, being a driven plate with both lateral sides bent into a sliding groove for embedding an external side of said sliding plate, and said driven plate including a plate aperture for passing a spindle bolt through another spindle hole and coupling said spindle bolt;

an axle structure, installed above said slid member and further comprising: a first pivotal axle, coupled at the top of said slid member by a stand board, and having an axle pillar passing through at least one resilient member, a spindle hole of said stand board, and a stand hole of a support stand to connect said axle pillar, said resilient member, said stand board and said support stand as a whole;

a second pivotal axle, with an end coupled to a vertical wall of said support stand through a pillar and another end passing through a plate aperture of a connecting board and at least one resilient member to connect said second pivotal axle, said support stand, said pillar, said connecting board and said resilient member as a whole;

thereby, said tension spring stores energy if pushed, and said slid member continues sliding all the way to a position of releasing said energy after said slid member is pushed more than half of the traveling path, and said support stand of said first pivotal axle can be turned forward or backward with respect to said slid member, and said connecting board of said second pivotal axle can be rotated on said support stand, so that said axle structure has the multi-directional pivotal rotating, idling and positioning functions.

6. The sliding module with an axle structure of claim 5, wherein said slid member comprises a board indent disposed at the top of said slid member and a connecting frame on both sides of said slid member is coupled to said stand board.

7. The sliding module with an axle structure of claim 5, wherein said spindle hole of said stand board and said stand hole of said support stand include a stop latch and a pushing latch protruded coaxially and alternatively in opposite directions at the periphery, a limit plate installed between said stand board and said support stand, and a pushing flange and a stop flange protruded according to a desired rotary angle; such that when said support stand rotates, said pushing latch pushes said pushing flange until said stop flange presses on said stop latch to restrict the angle of turning said support stand.

8. The sliding module with an axle structure of claim 5, wherein said resilient member is a spring, a wavy bracket or a disc bracket.

9. The sliding module with an axle structure of claim 5, further comprising a fixing plate installed between said pillar and said connecting board, and said fixing plate include two connecting plates protruded from said fixing plate and fixed to said pillar and at least one stop flange protruded from the periphery of said fixing plate and coupled to a stop tenon protruded from the periphery of said plate aperture at the bottom surface of said connecting plate, such that when said connecting plate is rotated, said stop tenon is in contact with said stop flange for stopping the rotation of said connecting plate.

10. The sliding module with an axle structure of claim 5, further comprising at least one plate protrusion protruded from the periphery of said plate aperture of said connecting board and at least one groove disposed on a corresponding surface of said fixing plate, such that if said connecting plate is rotated, said plate protrusion is rotated synchronously and thus giving a significant touch of a height difference when said plate protrusion falls into said groove.

* * * * *